(12) United States Patent
Taniguro

(10) Patent No.: US 9,289,841 B2
(45) Date of Patent: Mar. 22, 2016

(54) SOLDERING DEVICE, SOLDERING METHOD, AND SUBSTRATE AND ELECTRONIC COMPONENT PRODUCED BY THE SOLDERING DEVICE OR THE SOLDERING METHOD

(75) Inventor: Katsumori Taniguro, Tochigi (JP)

(73) Assignee: TANIGUROGUMI CORPORATION, Nasushiobara-shi, Tochigi (JP)

( * ) Notice: Subject to any disclaimer, the term of this patent is extended or adjusted under 35 U.S.C. 154(b) by 396 days.

(21) Appl. No.: 14/004,204

(22) PCT Filed: Apr. 16, 2012

(86) PCT No.: PCT/JP2012/060218
§ 371 (c)(1),
(2), (4) Date: Sep. 10, 2013

(87) PCT Pub. No.: WO2013/157064
PCT Pub. Date: Oct. 24, 2013

(65) Prior Publication Data
US 2014/0212678 A1 Jul. 31, 2014

(51) Int. Cl.
*B23K 31/02* (2006.01)
*B23K 3/06* (2006.01)
(Continued)

(52) U.S. Cl.
CPC ............. *B23K 3/0607* (2013.01); *B23K 1/0016* (2013.01); *B23K 1/08* (2013.01); *B23K 1/20* (2013.01); *B23K 1/203* (2013.01); *B23K 3/0646* (2013.01); *B23K 3/0669* (2013.01); *B23K 3/082* (2013.01); *B23K 35/262* (2013.01); *H01L 24/03* (2013.01); *H01L 24/05* (2013.01); *H01L 24/11* (2013.01); *H01L 24/13* (2013.01);
(Continued)

(58) Field of Classification Search
None
See application file for complete search history.

(56) References Cited

U.S. PATENT DOCUMENTS 2,933,412 A * 4/1960 Thayer, Jr. .................... 427/123
5,296,122 A * 3/1994 Katsube et al. .......... 204/298.04
(Continued)

FOREIGN PATENT DOCUMENTS

EP 2302083 A1 * 3/2011
JP 51-71977 A * 6/1976
(Continued)

*Primary Examiner* — Kiley Stoner
(74) *Attorney, Agent, or Firm* — Drinker Biddle & Reath LLP

(57) ABSTRACT

Provided are a soldering device and method which allow for soldering at low cost with high yield and high reliability. To solve the above problems, the soldering device has: a first processing section that immerses workpiece member 10 having copper electrode 2 in organic fatty acid-containing solution, and horizontally move immersed workpiece member 10 in organic fatty acid-containing solution 31; a second processing section having ejection unit 33 to spray a jet stream of molten solder 5a to workpiece member 10 while pulling out workpiece member 10 processed in the first processing section to space section 24 that has a pressurized steam atmosphere and is provided above organic fatty acid-containing solution 31; a third processing section having ejection unit 34 to spray organic fatty acid-containing solution 31 to excess molten solder 5a on workpiece member 10 for removal while pulling down workpiece member 10 processed in the second processing section after horizontally moving in space section 24; and a fourth processing section that picks up workpiece member 10 processed in the third processing section by pulling out from organic fatty acid-containing solution 31 after horizontally moving in organic fatty acid-containing solution 31.

9 Claims, 17 Drawing Sheets

(51) Int. Cl.

| | | |
|---|---|---|
| *B23K 1/08* | (2006.01) | |
| *B23K 1/20* | (2006.01) | |
| *B23K 35/26* | (2006.01) | |
| *H05K 3/28* | (2006.01) | |
| *H05K 3/34* | (2006.01) | |
| *B23K 3/08* | (2006.01) | |
| *B23K 1/00* | (2006.01) | |
| *H01L 23/00* | (2006.01) | |
| *H05K 3/00* | (2006.01) | |

(52) U.S. Cl.
CPC .......... *H01L 24/741* (2013.01); *H01L 24/742* (2013.01); *H05K 3/282* (2013.01); *H05K 3/3468* (2013.01); *H01L 2224/036* (2013.01); *H01L 2224/0381* (2013.01); *H01L 2224/03312* (2013.01); *H01L 2224/03418* (2013.01); *H01L 2224/03821* (2013.01); *H01L 2224/0401* (2013.01); *H01L 2224/0569* (2013.01); *H01L 2224/05073* (2013.01); *H01L 2224/05082* (2013.01); *H01L 2224/05111* (2013.01); *H01L 2224/05147* (2013.01); *H01L 2224/05582* (2013.01); *H01L 2224/05611* (2013.01); *H01L 2224/05647* (2013.01); *H01L 2224/116* (2013.01); *H01L 2224/11312* (2013.01); *H01L 2224/11821* (2013.01); *H01L 2224/1369* (2013.01); *H01L 2224/13111* (2013.01); *H01L 2224/741* (2013.01); *H01L 2924/381* (2013.01); *H05K 3/0085* (2013.01); *H05K 2203/081* (2013.01); *H05K 2203/122* (2013.01); *H05K 2203/1366* (2013.01); *H05K 2203/1518* (2013.01); *Y10T 428/31678* (2015.04)

(56) References Cited

U.S. PATENT DOCUMENTS

| | | | |
|---|---|---|---|
| 6,220,501 B1 | 4/2001 | Tadauchi et al. | |
| 7,095,116 B1 * | 8/2006 | Kelkar et al. | 257/737 |
| 7,148,569 B1 * | 12/2006 | Wang | 257/738 |
| 7,478,741 B1 * | 1/2009 | Newman | 228/103 |
| 2002/0076911 A1 * | 6/2002 | Lin | 438/613 |
| 2003/0222352 A1 * | 12/2003 | Kung et al. | 257/772 |
| 2006/0035453 A1 * | 2/2006 | Kim et al. | 438/613 |
| 2007/0040282 A1 | 2/2007 | Jung et al. | 257/780 |
| 2007/0090160 A1 * | 4/2007 | Masumoto | 228/101 |
| 2008/0035710 A1 * | 2/2008 | Furuno et al. | 228/223 |
| 2008/0296764 A1 * | 12/2008 | Chang et al. | 257/738 |
| 2009/0130840 A1 * | 5/2009 | Wang et al. | 438/614 |
| 2010/0127044 A1 * | 5/2010 | Ota et al. | 228/56.3 |
| 2011/0089567 A1 | 4/2011 | Ishikawa et al. | 257/772 |
| 2012/0044651 A1 * | 2/2012 | Horikawa et al. | 361/728 |
| 2012/0044652 A1 * | 2/2012 | Horikawa et al. | 361/728 |
| 2013/0206225 A1 * | 8/2013 | Zinn et al. | 136/256 |
| 2013/0269984 A1 * | 10/2013 | Taniguro | 174/251 |
| 2013/0343023 A1 * | 12/2013 | Nakagoshi et al. | 361/767 |
| 2014/0036427 A1 * | 2/2014 | Taniguro et al. | 361/679.01 |
| 2014/0178703 A1 * | 6/2014 | Nakano et al. | 428/457 |
| 2015/0102485 A1 * | 4/2015 | Kang et al. | 257/737 |
| 2015/0103495 A1 * | 4/2015 | Nakagoshi et al. | 361/728 |
| 2015/0115020 A1 * | 4/2015 | Taniguro | 228/180.22 |

FOREIGN PATENT DOCUMENTS

| | | | | |
|---|---|---|---|---|
| JP | 10-286936 | A | | 10/1998 |
| JP | H11-114667 | A | | 4/1999 |
| JP | 2005-131703 | A | * | 5/2005 |
| JP | 2009105356 | A | * | 5/2009 |
| JP | 2010003998 | A | * | 1/2010 |
| JP | 2011-114334 | A | | 6/2011 |
| JP | 2011-211137 | A | | 10/2011 |
| JP | 5191616 | B1 | * | 5/2013 |
| WO | WO 2009090776 | A1 | * | 7/2009 ............ H05K 3/34 |

* cited by examiner

Solder Sn·3Ag·0.5Cu

Solder Sn·3Ag·0.5Cu
·0.05Ni·0.005Ge

40

6 5 4 2    41    2 4 5 6

40

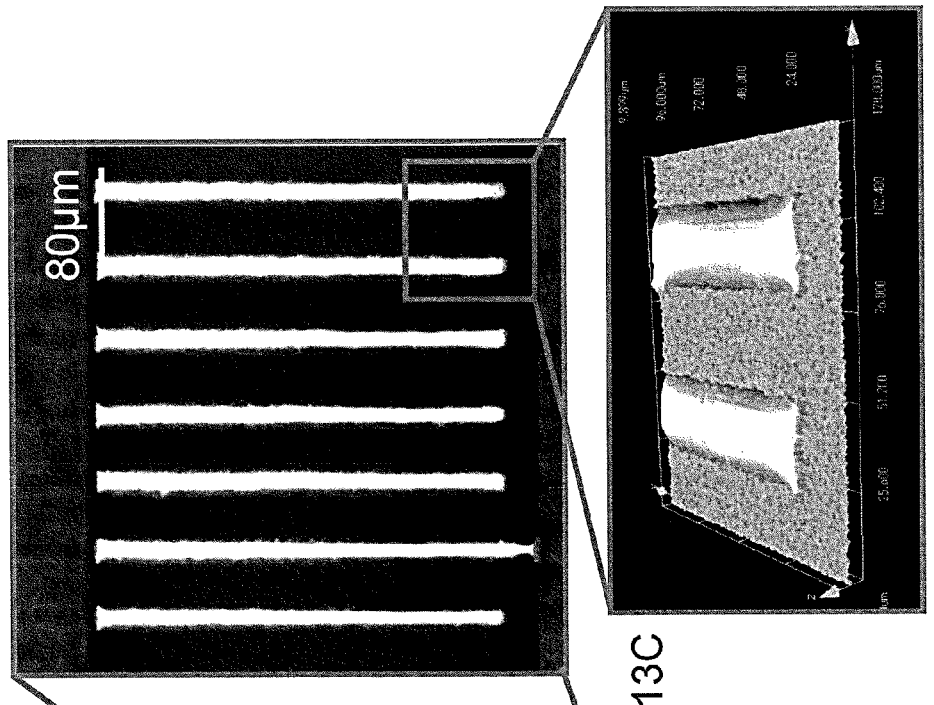
FIG. 13B
FIG. 13C
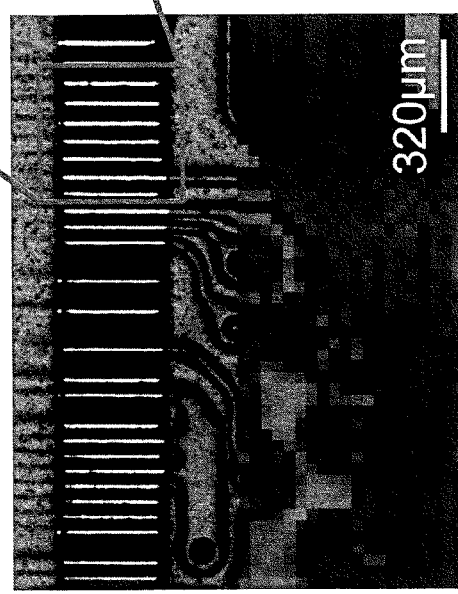
FIG. 13A

SOLDERING DEVICE, SOLDERING METHOD, AND SUBSTRATE AND ELECTRONIC COMPONENT PRODUCED BY THE SOLDERING DEVICE OR THE SOLDERING METHOD

FIELD OF THE INVENTION

The present invention relates to a soldering device and a soldering method, as well as to a substrate and an electronic component that are produced by the device or the method. More particularly, the invention relates to a device and a method for soldering, which allow for soldering at low cost with high yield and high reliability, as well as to a substrate and an electronic component that are produced by the device and the method.

BACKGROUND ART

In recent years, wiring density and mounting density on substrates such as printed circuit boards, wafers, and flexible substrates (which may be hereinafter referred to as "mounting substrates") have been further improved. The mounting substrate has many copper electrodes for soldering electronic components. On the copper electrodes are formed solder bumps, to which the electronic components are soldered in order to be mounted on the mounting substrate.

Solder bumps are in micro-size and uniform in shape, size, and the like. It is required that solder bumps be formed only at necessary portions. As a solder bump formation method satisfying such a requirement, Patent Document 1 has proposed a technique and the like for easily forming minute and uniform bumps by using a screen plate provided with openings for forming paste bumps with a paste and characterized in that it includes a rigid first metal layer, a resin-based adhesive layer, and a second metal layer, and the openings of the adhesive layer and the second layer have a smaller diameter than that of the opening of the first metal layer.

Meanwhile, in an electronic component such as a connector, a QFP (Quad Flat Package), an SOP (Small Outline Package), or a BGA (Ball Grid Array), sizes of connecting terminals, such as lead terminals, can vary. To solder electronic components with connection terminals having varied sizes without any soldering failure, it is necessary to reduce the influence of size variation in the electronic components by increasing the thickness of solder bumps formed on a mounting substrate. When a compact electronic component such as a CSP (Chip Size Package) is among electronic components mounted on a mounting substrate, the size of a solder bump for such a compact electronic component is very small and minute.

As a typical method for forming a solder bump, there is known a method of directly dipping (immersing) a mounting substrate provided with copper electrodes in a molten solder. However, when solder comes into contact with a copper electrode, the copper combines with tin contained in the solder in order to produce a Cu—Sn intermetallic compound. The Cu—Sn intermetallic compound is formed in a manner that the copper electrodes are corroded by the tin in the solder, which is thus sometimes called "copper corrosion", "copper erosion", or the like (hereinafter referred to as "copper corrosion"). Such copper corrosion can reduce reliability on copper electrodes as electrical joints and thereby can deteriorate reliability on a mounting substrate. Accordingly, it is necessary to shorten the time for dipping a mounting substrate in a molten solder in order to suppress copper corrosion. Therefore, there has been considered a method (a dipping method) in which a spare solder layer is formed on copper electrodes on a mounting substrate and then the mounting substrate is dipped in a molten solder.

PRIOR ART REFERENCES

Patent Documents

Patent Document 1: Japanese Laid-Open Patent Application No. 1998-286936

SUMMARY OF THE INVENTION

The Problems Solved by the Invention

Of the methods for forming a solder bump described above, the method for forming a solder bump using a screen plate has a problem of poor productivity. Further, the method for forming a solder bump by the dipping method causes a difference in copper corrosion between a first dipping (immersing) portion and a final dipping portion, thereby causing a difference in reliability on copper electrodes between respective portions of the same substrate. Therefore, the problem of copper corrosion has not been able to be solved yet.

The present invention has been accomplished to solve the above problems. It is an object of the present invention to provide a soldering device and a soldering method that allow for soldering at low cost, with high yield and high reliability. In addition, it is another object of the present invention to provide a substrate and an electronic component produced by the soldering device or the soldering method.

Problem Resolution Means (1) To solve the above-discussed problems, the soldering device according to the present invention has: a first processing section that immerses a workpiece member having a copper electrode in organic fatty acid-containing solution, and horizontally move the workpiece member in the organic fatty acid-containing solution; a second processing section having an ejection unit to spray a jet stream of a molten solder to the workpiece member while pulling out the workpiece member processed in the first processing section to a space section that has a pressurized steam atmosphere and is provided above the organic fatty acid-containing solution; a third processing section having an ejection unit to spray the organic fatty acid-containing solution to excess molten solder on the workpiece member for removal while pulling down the workpiece member processed in the second processing section after horizontally moving in the space section; a fourth processing section that picks up the workpiece member processed in the third processing section by pulling out from the organic fatty acid-containing solution after horizontally moving in the organic fatty acid-containing solution; a conveying unit move the workpiece member from the first processing section to the fourth processing section; a feeding portion into which the workpiece member is fed to the first processing section; and a discharge portion from which the workpiece member is discharged from the fourth section, wherein the first processing section to the fourth processing section are sealed except for the feeding portion and the discharge portion.

In the soldering device according to the present invention, (a1) the organic fatty acid-containing solution is preferably a palmitic acid-containing solution, (b1) the molten solder is preferably a molten solder processed with the organic fatty acid-containing solution, (c1) the liquid for removing the excess of the molten solder is preferably the organic fatty acid-containing solution, (d1) after processing in the fourth processing section, the soldering device preferably has an ejection unit that drains off the organic fatty acid-containing solution adhered to a surface of the workpiece member, (e1) the space section is preferably pressurized by steam of the organic fatty acid-containing solution, (f1) the temperature of the space section and the temperature of the organic fatty acid-containing solution are the same, and the temperature of the inside of the space section is the same as or higher than the temperature of molten solder sprayed in the space section, and (g1) the soldering device preferably has a circulation device that collects the molten solder deposited at the bottom of the organic fatty acid-containing solution below the ejection unit, and provide the collected molten solder to the ejection unit for spraying the molten solder.

(2) To solve the above-discussed problems, the soldering method according to the present invention includes: a first processing step of immersing a workpiece member having a copper electrode in organic fatty acid-containing solution, and horizontally moving the workpiece member in the organic fatty acid-containing solution; a second processing step of spraying a jet stream of a molten solder to the workpiece member while pulling out the workpiece member processed by the first processing step to a space section that has a pressurized steam atmosphere and is provided above the organic fatty acid-containing solution; a third processing step of spraying the organic fatty acid-containing solution to excess molten solder on the workpiece member for removal while pulling down the workpiece member processed by the second processing step after horizontally moving in the space section; a fourth processing step of picking up the workpiece member processed by the third processing step, by pulling out from the organic fatty acid-containing solution after horizontally moving in the organic fatty acid-containing solution; wherein a soldering device is used, the soldering device having: a conveying unit move the workpiece member from the first processing section to the fourth processing section; a feeding portion into which the workpiece member is fed to the first processing section; and a discharge portion from which the workpiece member is discharged from the fourth section, wherein the first processing section to the fourth processing section are sealed except for the feeding portion and the discharge portion.

In the soldering method according to the present invention, (a2) the organic fatty acid-containing solution is preferably a palmitic acid-containing solution, (b2) the molten solder is preferably a molten solder processed with the organic fatty acid-containing solution, (c2) the liquid for removing the excess of the molten solder is preferably the organic fatty acid-containing solution, (d2) after processing in the fourth processing step, the soldering method preferably includes a step of draining off the organic fatty acid-containing solution adhered to a surface of the workpiece member, (e2) the space section is preferably pressurized by steam of the organic fatty acid-containing solution, (f2) the temperature of the space section and the temperature of the organic fatty acid-containing solution are the same, and the temperature of the inside of the space section is the same as or higher than the temperature of molten solder sprayed in the space section, and (g2) the molten solder deposited at the bottom of the organic fatty acid-containing solution below the ejection unit is preferably re-used by collecting the molten solder and by providing the collected molten solder to the ejection unit for spraying the molten solder.

(3) To solve the above-discussed problems, the substrate according to the present invention is produced by the soldering device or the soldering method, and has a copper electrode on which a copper corrosion prevention layer, a solder layer, and an organic fatty acid coating layer are provided in this order from a surface of the copper electrode.

(4) To solve the above-discussed problems, the electronic component according to the present invention is produced by the soldering device or the soldering method, and has a copper electrode on which a copper corrosion prevention layer, a solder layer, and an organic fatty acid coating layer are provided in this order from a surface of the copper electrode.

Efficacy of the Invention

The soldering device and the soldering method according to the present invention continuously perform: immersion processing of the workpiece member in a first organic fatty acid-containing solution; adhesion processing of a molten solder with pulling out the workpiece member to the space section; removal processing of an excess of the molten solder with pilling down the workpiece member from the space section; and re-immersion processing of the workpiece member in the organic fatty acid-containing solution. Accordingly, there can be produced a substrate and an electronic component in which there occur neither copper corrosion of copper electrodes, as occurring in conventional dipping processing, nor copper corrosion in subsequent various mounting steps. As a result, a substrate and an electronic component having highly reliable copper electrodes as electrical joints and having high yield can be produced at low cost.

Particularly, after immersion of the workpiece member in the organic fatty acid-containing solution, while pulling out the workpiece member to the space section having a steam atmosphere of the organic fatty acid-containing solution, the jet stream of a molten solder is sprayed to copper electrodes formed on the workpiece member, and then, the organic fatty acid-containing solution is sprayed to an excess of the molten solder for removal while pulling down the work piece member from the space section. Thus, on the cleaned copper electrode surfaces, a copper corrosion prevention layer is uniformly formed without any defect, and furthermore, the member is immersed again in an organic fatty acid-containing solution in the state in which the excess molten solder has been removed, so as to provide an organic fatty acid coating layer. As a result, in the state in which a minimum solder layer is provided on the copper corrosion prevention layer, there is provided the organic fatty acid coating layer maintaining solder wettability of the solder layer. Thus, in subsequent mounting steps, even when the member is dipped in various molten solder baths, fed in a re flow furnace after printing of paste solder, or fed in a combustion furnace, copper corrosion of the copper electrodes does not occur, without deteriorating the solder wettability, and the member can be processed at the subsequent mounting steps.

In the substrate and the electronic component according to the present invention, on copper electrodes of the substrate and the electronic component, a copper corrosion prevention layer, a solder layer, and an organic fatty acid coating layer are provided in this order from the surfaces thereof. Thus, even when heat is applied in a reflow furnace, a combustion furnace or the like after that, the copper corrosion prevention layer blocks corrosion of the copper electrodes. As a result of that, in mounting steps of an electronic component performed through various steps, there is no reduction in reliability on electrical joints (copper electrode portions) and high yield production can be achieved even when the electrical joints has a copper microelectrodes. Therefore, a substrate and an electronic component that are highly reliable can be provided at low cost.

BRIEF DESCRIPTIONS OF THE DRAWINGS

FIG. 7A is a schematic cross-sectional view of a copper electrode portion formed in a Comparative Example and FIG. 7B is a schematic cross-sectional view of a copper electrode portion formed in an Example.

FIGS. 11A and 11B are results of the Comparative Example, and FIGS. 11C and 11D are results of the Example.

FIGS. 13A and 13B are optical micrographs showing a configuration that has a copper corrosion prevention layer, a solder layer and an organic fatty acid coating layer in order on a copper electrode having a micro substrate, and FIG. 13C is an electron micrograph showing the configuration.

EMBODIMENTS OF THE INVENTION

Hereinafter, a description will be given of a soldering device and a soldering method according to the present invention, as well as a substrate and an electronic component that are produced by the soldering device and the soldering method according to the present invention, with reference to the drawings. In the present application, the term "the present invention" can be said in other words as "embodiment of the present invention". In addition, the term "copper corrosion prevention layer" means a layer serving to prevent the corrosion of a copper electrode (which means a situation in which copper atoms diffuse and elute) due to solder.

[Soldering Apparatus and Soldering Method]

Figure 1:
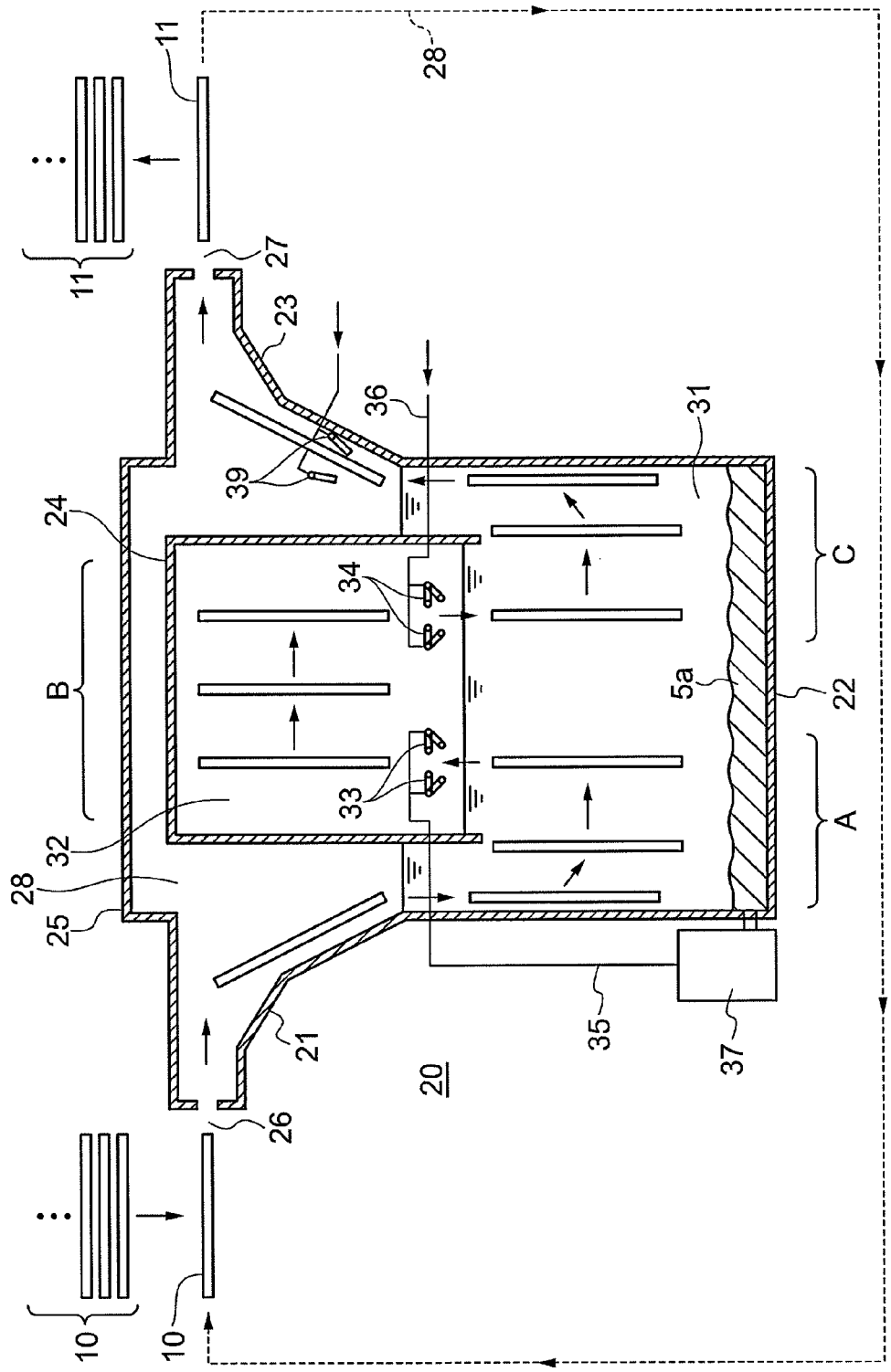
FIG. 1 is a schematic structural view illustrating one example of a soldering device according to the present invention.

Soldering device 20 and a soldering method according to the present invention are, as shown in FIG. 1, are an device and a method continuously performing: immersion processing in organic fatty acid-containing solution 31 (immersion processing unit A); adhesion processing of molten solder 5a while pulling out from space section 32 (adhesion processing unit B); removal processing of an excess of molten solder 5a while pulling down from space section 32 (removal processing unit B); and re-immersion processing in organic fatty acid-containing solution 31 (re-immersion processing unit C). By such soldering device 20 and such a soldering method, there can be produced a substrate and an electronic component in which there occurs no copper corrosion of copper electrodes, as occurring in conventional dipping processing, as well as no copper corrosion occurs in subsequent various mounting steps. As a result, there can be produced a substrate and an electronic component having high reliability on copper electrodes as electrical joints and achieving high yield at low cost.

Hereinafter, a detailed description will be given of each structure and each step of the device.

(Workpiece Member)

Workpiece member 10 is used to soldering device 20 and the soldering method. Specific examples of workpiece member 10 include substrates (which may also be referred to as "mounting substrates"), such as a printed circuit board, a wafer, and a flexible substrate, and electronic components such as a connector, a QFP (Quad Flat Package), an SOP (Small Outline Package), a BGA (Ball Grid Array), a semiconductor chip, a chip resistor, a chip capacitor, and a jumper wire. In addition, the examples thereof also include known substrates and electronic components other than those exemplified herein, and new substrates and electronic components that will be developed in the future.

Workpiece member 10 is provided with copper electrode 2 on substrate 1 in an arbitrary form, and soldering device 20 and the soldering method according to the present invention are an device and a method applied upon soldering to such copper electrode 2.

Figure 2:
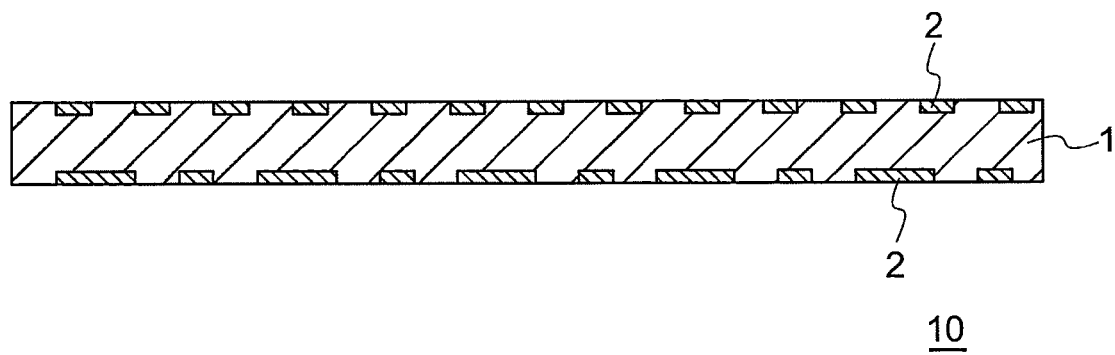
FIG. 2 is a schematic cross-sectional view illustrating one example of a substrate as a workpiece member.
Figure 8:
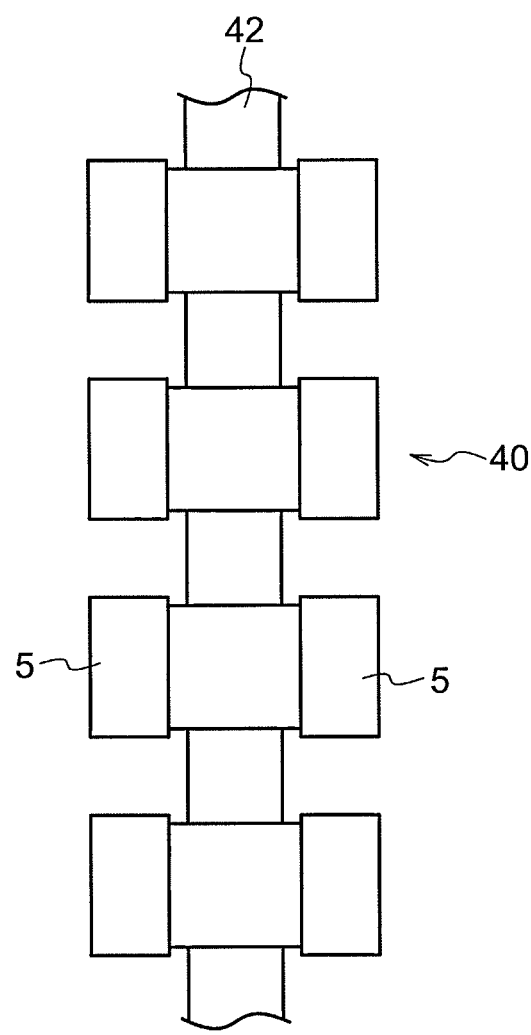
FIG. 8 is a schematic view illustrating one example of an electronic component that has been subjected to continuous processing while being supported by a support jig.

Such workpiece member 10 is conveyed continuously in soldering device 20, for example, by a conveying unit 28 (a belt conveyor) which is illustrated by a loop with dotted lines and the arrows in FIG. 1. As a fixing jig for fixing workpiece member 10 to the conveying unit 28 or upon conveyance thereof by conveying unit 28, there may be used various kinds of jigs along a shape of workpiece member 10 conveyed. For example, in a case of a printed circuit board shown in FIG. 2, a frame-shaped jig (not shown) supporting by enclosing the rectangular printed circuit board by a rim thereof may be arbitrarily used. For example, in a case of electronic component 40 shown in FIG. 8, support jig 42 corresponding to a shape of electronic component 40 may be arbitrarily used.

(Immersion Processing in First Organic Fatty Acid-Containing Solution)

Workpiece member 10 is fed from feeding portion 26 of feeding unit 21 in soldering device 20 of FIG. 1. Fed workpiece member 10 is immersed by pulling down to organic fatty acid-containing solution bath 22 in immersion processing unit A. First organic fatty acid-containing solution bath 22 is filled with a predetermined amount of organic fatty acid-containing solution 31. The size and shape of organic fatty acid-containing solution bath 22 are not specifically limited. However, preferably, organic fatty acid-containing solution bath 22 has a size and a shape that are sufficient to allow for immersion of workpiece member 10 in organic fatty acid-containing solution 31, as well as that do not hinder continuous conveyance of workpiece member 10. In examples of FIG. 1, organic fatty acid-containing solution bath 22 is composed by a rectangular or cylindrical water tank structure, and immersion processing unit A of organic fatty acid-containing solution bath 22 is arranged near the rim of organic fatty acid-containing solution bath 22. Further, immersion processing unit A is arranged symmetrically with re-immersion processing unit C discussed later. Additionally, immersed work piece 10 is horizontally transferred up to the point where immersed work piece 10 is pulled out in order to perform adhesion processing of molten solder discussed later.

Organic fatty acid-containing solution 31 in organic fatty acid-containing solution bath 22 has the same temperature every part, such as immersion processing unit A and re-immersion processing unit C. Since the temperature of organic fatty acid-containing solution 31 is decided depending on the jet stream temperature of molten solder 5a since the temperature of space section 24 is set to be the same or roughly the same as the jet stream temperature of molten solder 5a by the steam evaporated from organic fatty acid-containing solution 31. For example, when the jet stream temperature of molten solder 5a is 250° C., the temperature of organic fatty acid-containing solution 31 is also preferably the same or roughly the same as that. By setting the temperature of the solution to the temperature as above, the temperature of the steam evaporated from organic fatty acid-containing solution 31 can be set to be the same or roughly the same as the jet stream temperature of molten solder 5a. As a means for controlling the temperature of organic fatty acid-containing solution 31, a heater or a condenser may be wound around the circumference of organic fatty acid-containing solution bath 22, a heater or a condenser tube may be inserted in the bath, or organic fatty acid-containing solution 31 in the bath may be circulated through a piece of temperature regulation equipment (not shown) for the temperature control.

Further, the temperature of the portion to feed non-processed workpiece member 10 into organic fatty acid-containing solution 31 and the temperature of the portion to pull out processed workpiece member 10 from organic fatty acid-containing solution 31 may be lower than the other portions of organic fatty acid-containing solution 31. The temperatures of the other portions of organic fatty acid-containing solution 31 cannot be generally decided since the temperatures are different in types of the substrates or solders. However, for the example, the temperatures of the other portions of organic fatty acid-containing solution 31 are controlled as about 50° C. to 250° C. As a means for controlling the temperature of the other portions of organic fatty acid-containing solution 31, a heater or a condenser may be wound around the circumference of the portions of the bath, such as the portion to feed non-processed workpiece member 10 into organic fatty acid-containing solution 31 and the portion to pull out processed workpiece member 10 from organic fatty acid-containing solution 31, a heater or a condenser tube may be inserted in the portions of the bath. Setting the temperature of organic fatty acid-containing solution 31 can prevent the occurrence of defects or the like due to thermal expansion when workpiece member 10 at room temperature is suddenly fed in organic fatty acid-containing solution 31 at high temperature, as well as can prevent the occurrence of defects or the like due to thermal shrinkage when workpiece member 10 in organic fatty acid-containing solution 31 at high temperature is suddenly pulled out at room temperature.

Organic fatty acid-containing solution 31 in first organic fatty acid-containing solution bath 22 is preferably a solution containing an organic fatty acid having 12 to 20 carbon atoms. Even if the solution contains an organic fatty acid having 11 or lower carbon atoms, it is usable. However, such an organic fatty acid is water absorbent and thus not very preferable when used, for example, in the low temperature of organic fatty acid-containing solution 31 at the feeding section 21 or discharge section 23. In addition, organic fatty acids having 21 or more carbon atoms have problems, such as high melting point, poor permeability, and difficult handling. As a typical one, preferred is palmitic acid having 16 carbon atoms. It is particularly preferable to use only palmitic acid having 16 carbon atoms as the organic fatty acid, and as needed, an organic fatty acid having 12 to 20 carbon atoms, for example, stearic acid having 18 carbon atoms may also be contained.

Preferably, organic fatty acid-containing solution 31 which includes 5 mass % to 25 mass % of palmitic acid and an ester synthetic oil for the rest is used. By using such organic fatty acid-containing solution 31, organic fatty acid-containing solution 31 selectively incorporates impurities such as oxide and flux components present on a surface of copper electrode 2 of workpiece member 10 which is fed into organic fatty acid-containing solution 31 from feeding section 21, so that the surface of copper electrode 2 can be cleaned. Particularly preferably, organic fatty acid-containing solution 31 contains palmitic acid having 16 carbon atoms in an amount of around 10 mass % (for example, 5 mass % to 15 mass %). Furthermore, organic fatty acid-containing solution 31 does not contain metal salts such as nickel chloride or cobalt chloride and an additive such as an antioxidant.

If the organic fatty acid has a concentration of less than 5 mass %, an effect of selectively incorporating and purifying impurities such as oxide and flux components present on the surface of copper electrode 2 is slightly low, and also control of the incorporation and the purification of the impurities at low concentration can be complicated. On the other hand, if the concentration of the organic fatty acid is more than 25 mass %, there are problems such as an increased viscosity in organic fatty acid-containing solution 31 and the occurrence of fuming and odor in a high temperature range of 300° C. or higher. Accordingly, the content of the organic fatty acid is preferably 5 mass % to 20 mass %. Particularly, when using only palmitic acid having 16 carbon atoms, the content thereof is preferably around 10 mass % (for example, 5 mass % to 15 mass %).

In first organic fatty acid-containing solution bath 22, workpiece member 10 fed in organic fatty acid-containing solution 31 described above is immersed, with the result that oxide and impurities present on the surface of copper electrode 2 of workpiece member 10 are removed for cleaning. Then, on the surface of copper electrode 2 is formed coating layer 3 (see FIG. 4(B)) of the organic fatty acid forming organic fatty acid-containing solution 31. Coating layer 3 can clean the surface of copper electrode 2 and additionally can suppress the oxidation of the surface of copper electrode 2 in order to prevent the production of an oxidized coat film.

(Space Section)

As shown in FIG. 1, workpiece member 10 is processed by organic fatty acid-containing solution 31 of immersion processing unit A and consequently pulled out to space section 24 as processing section C. Space section 24 is a space section having a pressurized steam atmosphere of organic fatty acid-containing solution 31 that is the same or roughly the same as organic fatty acid-containing solution 31, and a space section horizontally having: ejection unit 33 that sprays jet stream 5' of molten solder 5a to copper electrode 2 provided on workpiece member 10; and ejection unit 34 that sprays organic fatty acid-containing solution 3 to an excess of molten solder 5a for removal.

Space section 24 is preferably filled with a steam or the like of organic fatty acid-containing solution 31 and in a pressurized state. Pressure in space section 24 is not specifically limited, but is preferably around 0.1 Pa. Particularly, due to the state of the section pressurized in the above range by the steam of organic fatty acid-containing solution 31, copper electrode 2 of workpiece member 10 is neither oxidized nor contaminated with any impurity. Space section 24 is formed as follows: after filling organic fatty acid-containing solution 31 up to an upper surface of space section 24, by first introducing nitrogen gas in order to lower the liquid surface of the organic fatty acid-containing solution so as to first form space section 24 as shown in FIG. 1; and by subsequently heating of organic fatty acid-containing solution 31 in order to fill space section 24 with the steam thereof.

An atmospheric temperature of space section 24 is preferably the same temperature as that of molten solder 5a for soldering or a temperature close thereto. The atmospheric temperature thereof may be the same as that of molten solder 5a but is preferably set to be slightly higher than the temperature of molten solder 5a. For example, the atmospheric temperature thereof is preferably set to be 2° C. to 10° C. higher than a jet stream temperature of molten solder 5a, and more preferably set to be 2° C. to 5° C. higher than that thereof. By setting the atmospheric temperature of space section 24 within the above temperature range, jet stream 5' of molten solder 5a after having been ejected on the surface of copper electrode 2 can be uniformly flown on the surface of copper electrode 2. Particularly, molten solder 5a can be spread out to every corner of surfaces of copper electrodes with fine pitch and copper electrodes with small area. If the atmospheric temperature is lower than the jet stream temperature of molten solder 5a, viscosity of molten solder 5a is reduced and fluidity of molten solder 5a can be lowered. On the other hand, if the atmospheric temperature is set to be higher than 10° C., too high temperature can cause heat damage to workpiece member 10.

Under space section 24 is located organic fatty acid-containing solution bath 22, and space section 24 is filled with the steam of the organic fatty acid-containing solution evaporated from organic fatty acid-containing solution bath 22. The amount of the organic fatty acid-containing solution is not specifically limited. However, preferably, the amount of the organic fatty acid-containing solution is an amount capable of generating a steam for setting the pressure of space section 24 to around 0.1 MPa.

The temperature of organic fatty acid-containing solution 31 is determined depending on the jet stream temperature of molten solder 5a, since the temperature of space section 24 is set to be the same or roughly the same as the jet stream temperature of molten solder 5a by the steam evaporated from organic fatty acid-containing solution 31. For example, when the jet stream temperature of molten solder 5a is 250° C., the temperature of organic fatty acid-containing solution 31 is also preferably the same or roughly the same as that. By setting the temperature of the solution to the temperature as above, the temperature of the steam evaporated from organic fatty acid-containing solution 31 can be set to be the same or roughly the same as the jet stream temperature of molten solder 5a. As a means for controlling the temperature of organic fatty acid-containing solution 31, a heater or a condenser may be wound around the circumference of organic fatty acid-containing solution bath 22, a heater or a condenser tube may be inserted in the bath, or organic fatty acid-containing solution 31 in the bath may be circulated through a piece of temperature regulation equipment (not shown) for the temperature control.

(Ejection Processing of Molten Solder)

In space section 24 as processing section C, the ejection processing (which may also be referred to as adhesion processing) to eject molten solder 5a to copper electrode 2 of workpiece member 10 is performed. In other words, eject stream 5' of molten solder 5a is ejected to workpiece member 10 while pulling out workpeace member 10 to the upside of space section 24 from organic fatty acid-containing solution 31 in order to attach molten solder 5a to copper electrode 2. The ejection processing is performed by ejection nuzzle 33 for spraying jet stream 5' of molten solder 5a, and for example, ejection nozzle 33 as shown in FIG. 1. Preferably, ejection nuzzle 33 are arranged at surfaces where copper electrode 2 is formed. Additionally, workpiece member 10 is generally arranged on both surface of workpiece member 10.

First, a description will be given of molten solder 5a ejected from ejection heat and fluidizing it to an extent capable of being sprayed as jet stream 5'. Heating temperature is arbitrarily selected depending on solder composition. However, usually, a favorable temperature is determined from a range of about 150° C. to 300° C. The present invention uses a molten lead-free solder containing tin as a main component and at least nickel as an accessory component, as well as arbitrarily contains, as an accessory component, one or two or more selected from silver, copper, zinc, bismuth, antimony, and germanium.

A preferable solder composition is Sn—Ni—Ag—Cu—Ge alloy. Specifically, it is preferable to use a solder alloy containing 0.01 mass % to 0.5 mass % of nickel, 2 mass % to 4 mass % of silver, 0.1 mass % to 1 mass % of copper, 0.001 mass % to 0.02 mass % of germanium, and tin for the rest, in order to form Cu—Ni—Sn intermetallic layer 4 (see FIG. 8B) that can stably prevent copper erosion. A particularly preferable composition for forming such Cu—Ni—Sn intermetallic layer 4 is a solder alloy containing 0.01 mass % to 0.07 mass % of nickel, 0.1 mass % to 4 mass % of silver, 0.1 mass % to 1 mass % of copper, 0.001 mass % to 0.01 mass % of germanium, and tin for the rest. When soldering is performed using such an Sn—Ni—Ag—Cu—Ge alloy, the alloy is preferably used as molten solder 5a having a temperature of 240° C. to 260° C.

In addition, a bismuth-containing solder can further reduce the heating temperature of molten solder 5a and, for example, by the adjustment of a component composition of the solder, the temperature can be reduced down close to 150° C. Such temperature reduction is more preferable, since the temperature of steam of the inside of space section 24 can also be reduced. As with the above composition, the composition of bismuth-containing solder also preferably contains 0.01 mass % to 0.5 mass % of nickel, and more preferably contains 0.01 mass % to 0.07 mass % of nickel. In this manner, there can be prepared low-temperature type molten solder 5a that can easily form Cu—Ni—Sn intermetallic compound layer 4.

In addition, other zinc and antimony also are blended as needed. In any case, the solder composition contains at least nickel in the amount of preferably 0.01 mass % to 0.5 mass %, and more preferably 0.01 mass % to 0.07 mass %.

Molten solder 5a having such a composition is a lead-free solder that does not contain lead, as well as essentially contains the above content of nickel. Thus, as shown in FIG. 6B, nickel contained in molten solder 5a combines with copper of copper electrode 2 and additionally combines with tin of molten solder 5a, so that Cu—Ni—Sn intermetallic compound layer 4 can be easily formed on the surface of copper electrode 2. Cu—Ni—Sn intermetallic compound layer 4 formed serves as a copper corrosion prevention layer of copper electrode 2 in order to prevent defects or dissipation of copper electrode 2. Accordingly, in subsequent steps, solder layer 5 having Cu—Ni—Sn intermetallic compound layer 4 can easily endure even a processing that can be hard for copper electrode 2, as in a case of feeding a substrate with solder layer 5 formed thereon in a dipping step for dipping in a solder bath. Therefore, even when performing a low cost solder dipping step, there can be formed highly reliable solder layer 5 with high yield. Furthermore, there can be obtained a mounting substrate, with high yield, which allows the mounting of an electronic component using solder layer 5 to be performed at low cost with high reliability.

It is know that A nickel content in molten solder 5a affects on a thickness of Cu—Ni—Sn intermetallic compound layer 4. Specifically, when the nickel content is in a range of 0.01 mass % to 0.5 mass % (preferably, 0.07 mass % or lower), there can be produced Cu—Ni—Sn intermetallic compound layer 4 with a roughly uniform thickness of about 1 µm to 3 µm. Cu—Ni—Sn intermetallic compound layer 4 having a thickness within the range can prevent copper in copper electrode 2 from dissolving into molten solder 5a or solder layer 5 to be corroded.

When the nickel content is 0.01 mass %, the thickness of Cu—Ni—Sn intermetallic compound layer 4 is about 1 µm to 1.5 µm. With the nickel content of, for example, 0.07 mass %, Cu—Ni—Sn intermetallic compound layer 4 has a thickness of about 2 µm, and with the nickel content of 0.5 mass %, Cu—Ni—Sn intermetallic compound layer 4 has a thickness of about 3 µm.

If the nickel content is less than 0.01 mass %, the thickness of Cu—Ni—Sn intermetallic compound layer 4 is less than 1 µm, which can cause a portion of copper electrode 2 to be unable to be covered by Cu—Ni—Sn intermetallic compound layer 4, easily causing copper corrosion from the portion. If the nickel content is more than 0.5 mass %, the thickness of hard Cu—Ni—Sn intermetallic compound layer 4 exceeds 3 µm to be larger, which can cause a crack in the Cu—Ni—Sn intermetallic compound layer 4. As a result, from the cracked part, copper corrosion easily occurs. A preferably nickel content is 0.01 mass % to 0.07 mass %. Molten solder 5a having a nickel content within the range is more unlikely to cause a crack in Cu—Ni—Sn intermetallic compound layer 4 than that having a nickel content more than 0.07 mass % and 0.5 mass % or less, and can form a smooth uniform layer.

Solder used as molten solder 5a is preferably one that has been subjected to purification processing. Specifically, a solution containing 5 mass % to 25 mass % of an organic fatty acid having 12 to 20 carbon atoms is heated to 180° C. to 350, and the heated solution is contacted with molten solder 5a to strongly stir and mix together. This allows the cleaning of molten solder 5a before purification processing, which has been contaminated with copper oxide, a flux component, and the like, so that there can be obtained molten solder 5a from which copper oxide, a flux component, and the like have been removed. After that, a mixture solution containing molten solder 5a from which copper oxide, a flux component, and the like have been removed is introduced in an organic fatty acid-containing solution bath (not shown). Then, molten solder 5a after cleaning, which has been separated by a specific gravity difference in the organic fatty acid-containing solution bath, is returned from a bottom of the organic fatty acid-containing solution bath to a lead-free solder liquid storage tank through a pump. Performing such a purification processing can suppress an increase with time in copper concentration and impurity concentration in molten solder 5a used as a jet stream, as well as can prevent the introduction of impurities such as copper oxide and a flux residue into the lead-free solder liquid storage tank. As a result, composition changes with time in molten solder 5a in the lead-free solder liquid storage tank can be suppressed, whereby solder layer 5 using molten solder 5a having stable and high joining reliability can be continuously formed. In addition, a mounting substrate provided with such solder layer 5 can be continuously produced.

Purified molten solder 5a does not contain impurities such as copper oxide and a flux residue affecting on the joining quality of solder layer 5. Further, purified molten solder 5a has lower viscosity than non-processed molten solder. As a result, when solder layer 5 formed on copper electrode 2 having a micro pattern, solder layer 5 is uniformly formed on copper electrode 2, and there occurs no lot-to-lot variation in the joining quality between solder layer 5 and an electronic component, which can contribute to chronological quality stabilization.

The organic fatty acid contained in the organic fatty acid-containing solution used for purification is the same as that contained in organic fatty acid-containing solution 31 described above. Thus, an explanation thereof is omitted here. The temperature of the organic fatty acid-containing solution used for purification is determined by a melting point of molten solder 5a to be purified, and the organic fatty acid-containing solution and molten solder 5a are strongly stirred to be contacted with each other at a high temperature range of at least the melting point of molten solder 5a or higher (as one example, 240° C. to 260° C.). In addition, An upper limit temperature of the organic fatty acid-containing solution is about 350° C. from the viewpoint of a fuming problem and energy saving, and is desirably within a range of from a temperature, which is equal to or higher than the melting point of molten solder 5a to be subjected to purification processing, to 300° C. For example, since the solder alloy containing 0.01 mass % to 0.07 mass % of nickel, 0.1 mass % to 4 mass % of silver, 0.1 mass % to 1 mass % of copper, 0.001 mass % to 0.01 mass % of germanium, and tin for the rest is used as molten solder 5a at the temperature of 240° C. to 260° C., the temperature of the organic fatty acid-containing solution also is preferably the same as that, about 240° C. to 260° C.

Figure 4A:
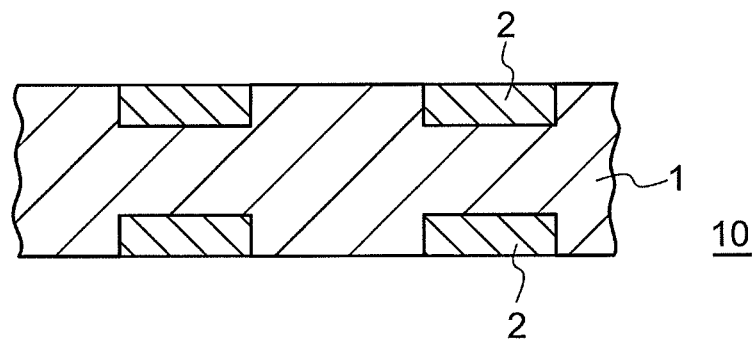
FIGS. 4A to 4D are schematic cross-sectional views illustrating a shape of the workpiece member, respectively, after having passed through each processing section or each step.
Figure 4B:
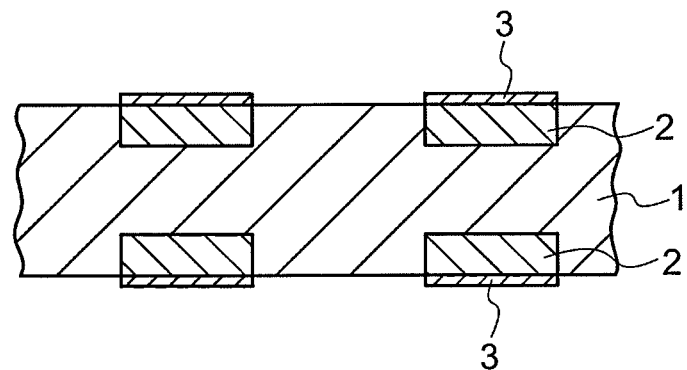
Figure 4C:
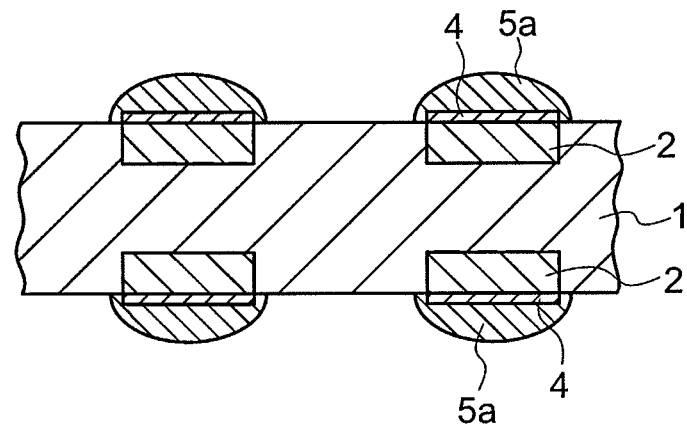
Figure 4D:
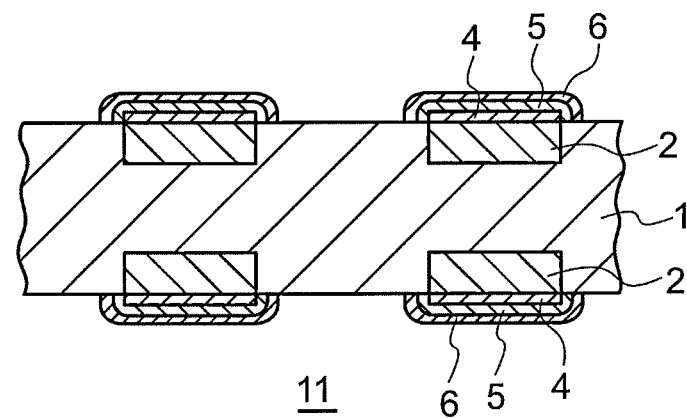
Figure 5:
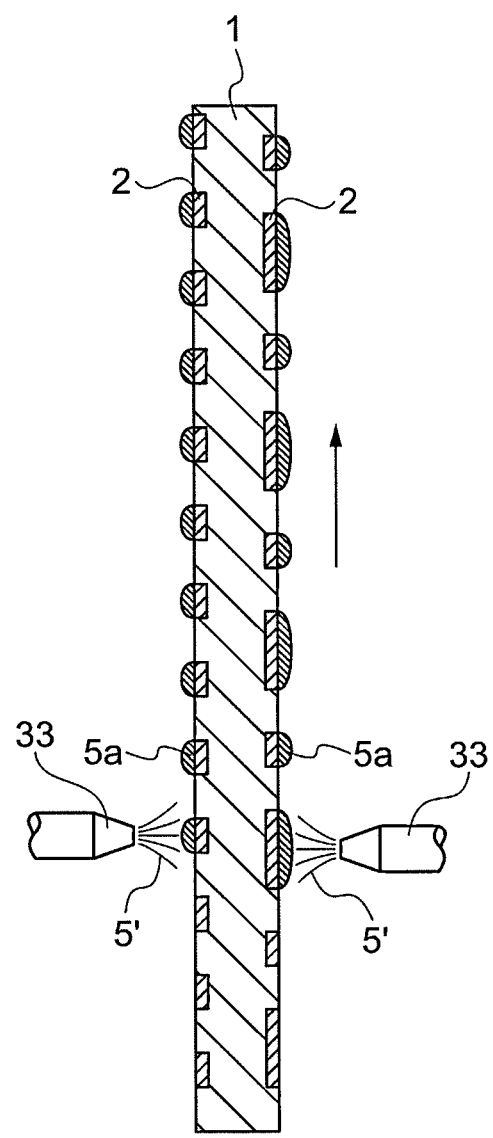
FIG. 5 is a schematic cross-sectional view illustrating a step of ejecting a molten solder on a copper electrode for adhesion of the molten solder to the electrode.

Molten solder 5a purified by such an organic fatty acid-containing solution is, as shown in FIG. 1 and FIG. 5, sprayed as jet stream 5' from ejection unit 33 to workpiece member 10 during pulling out workpiece member 10 to the upside of organic fatty acid-containing solution 31 from organic fatty acid-containing solution 31. Ejection pressure of molten solder 5a from ejection unit 33 is not specifically limited and arbitrarily set according to the kind, temperature, viscosity, and the like of molten solder 5a. Usually, molten solder 5a is ejected at a pressure of about 0.3 MPa to 0.8 MPa. The preferable atmospheric temperature is, as described above, a temperature that is the same or roughly the same as (preferably, slightly higher than) the jet stream temperature of molten solder 5a. In this manner, as shown in FIG. 4 and FIG. 5, swollen molten solder 5a is formed. Additionally, flow speed and spraying time of jet stream 5' of molten solder 5a sprayed from ejection unit 33 are arbitrarily set based on the kind and the like of molten solder 5a. In addition, conditions such as the shape and spraying angle of ejection unit 33, are also arbitrarily formed or set based on the kind and the like of molten solder 5a.

(Removal Processing of Excess Molten Solder)

Figure 6:
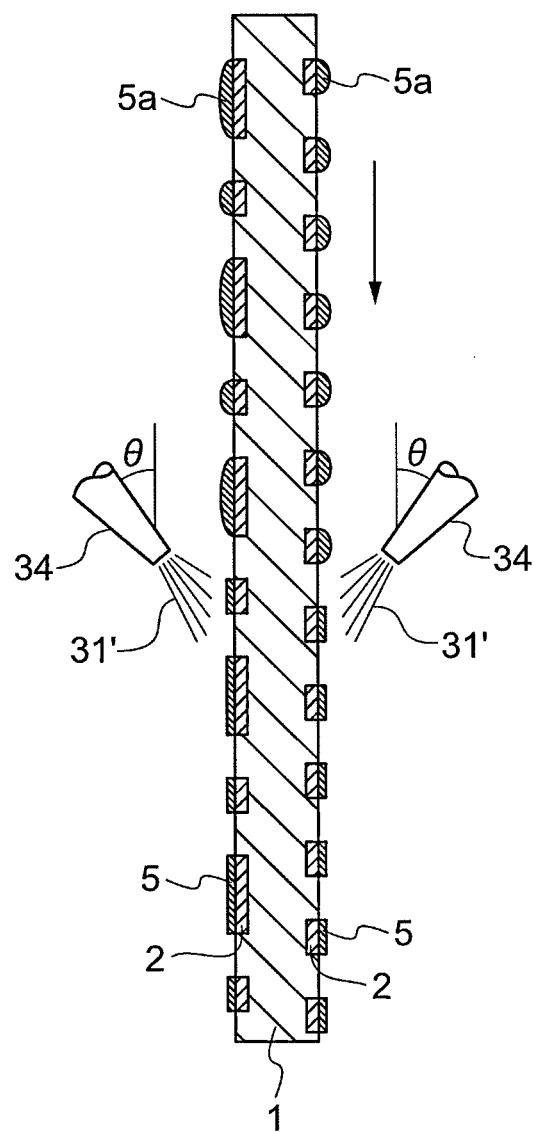
FIG. 6 is a schematic cross-sectional view illustrating a step of removing an excess molten solder by ejecting an organic fatty acid-containing solution.
Figure 7A:
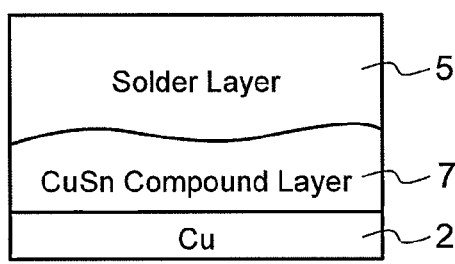
FIGS. 7A and 7B are examples of an intermetallic compound layer formed on a copper electrode.
Figure 7B:
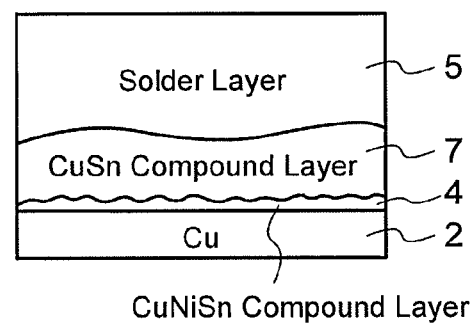

As shown in FIG. 1, workpiece member 10 with swollen molten solder 5a is transferred in the horizontal direction in space section 24 after pulling out workpiece member 10 in space section 2. Subsequently, the step is shifted to spray organic fatty acid-containing solution 31' to an excess of molten solder 5a for removal. Such removal step is a step to spray organic fatty acid-containing solution 31' from ejection unit 34 arranged in an area where workpiece member 10 is transferred in space section 24 during pulling down workpiece member 10 in organic fatty acid-containing solution 31'. By the removal processing, molten solder 5a swollen on copper electrode 2 is removed, as shown in FIG. 4C and FIG. 6 and only molten solder 5a that cannot be removed can be left. Molten solder 5a incapable of being removed means molten solder 5a adhered to Cu—Ni—Sn intermetallic compound layer 4 formed on copper electrode 2, and the adhered molten solder 5a forms solder layer 5.

Organic fatty acid-containing solution 31' for removing molten solder 5a is the same or roughly the same as organic fatty acid-containing solution 31 contained in organic fatty acid-containing solution bath 22. Since space section 24 is under the steam atmosphere of the organic fatty acid-containing solution 31, the same solution as organic fatty acid-containing solution 31 is used as organic fatty acid-containing solution 31'. In addition, an inert gas such as nitrogen gas may be partially mixed, but air, water, and the like containing oxygen are not allowed to be mixed from the viewpoint of oxidation of solder layer 5 and compatibility into the organic fatty acid-containing solution. Ejection pressure of organic fatty acid-containing solution 31' from ejection unit 33 is not specifically limited and arbitrarily set according to the kind, temperature, viscosity, and the like of molten solder 5a. Usually, organic fatty acid-containing solution 31' is ejected at a pressure of about 0.2 MPa to 0.4 MPa.

Figure 9A:
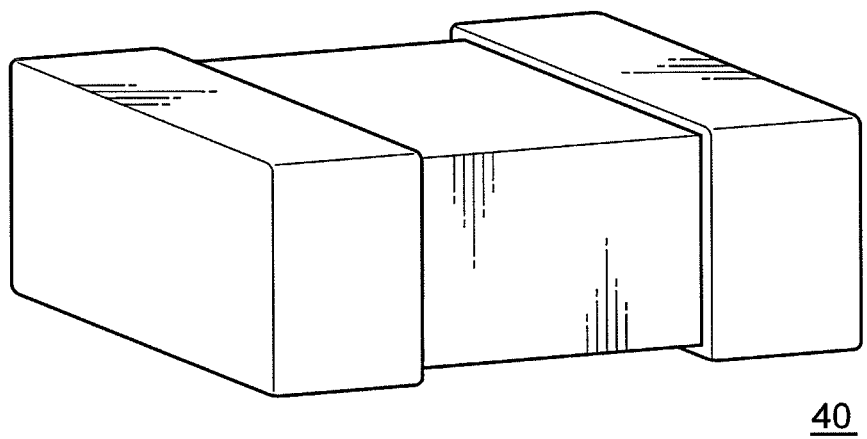
FIGS. 9A and 9B are a perspective view and a cross-sectional view illustrating one example of a produced electronic component.
Figure 9B:
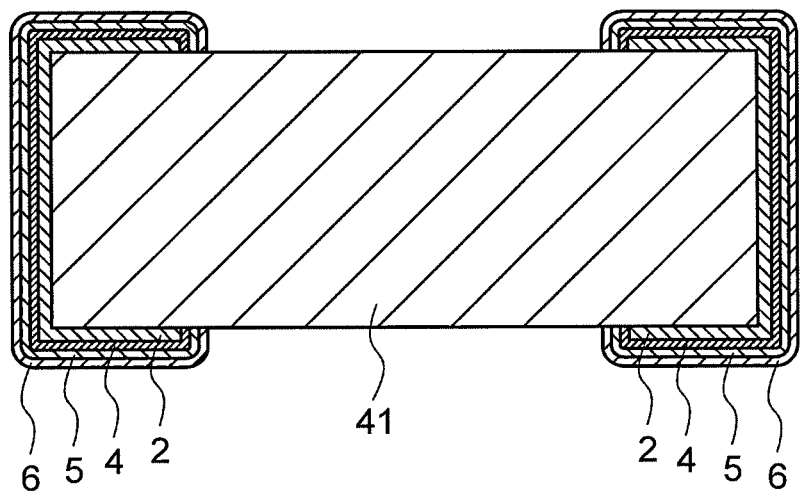
Figure 10A:
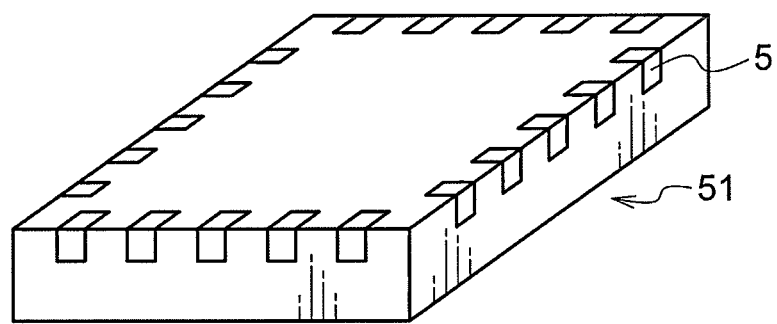
FIGS. 10A and 10B are perspective views illustrating other examples of produced electronic components.
Figure 10B:
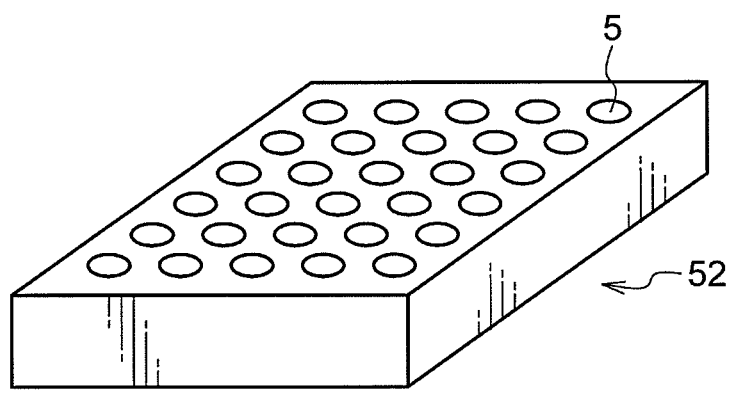

The temperature of organic fatty acid-containing solution 31' used as the ejected liquid is preferably the same or roughly same as that of molten solder 5a (for example, around 250° C.). In this manner, excess molten solder 5a is blown off, and simultaneously, organic fatty acid coating layer 6 (see FIG. 4D and FIG. 9B) can be formed on an exposed surface of molten solder 5a.

(Reuse of Molten Solder)

In a bottom of organic fatty acid-containing solution bath 22 below space section 24, molten solder 5a sprayed from ejection unit 33 or molten solder 5a removed and fell down by ejection unit 34 are deposited based on the specific gravity difference between organic fatty acid-containing solution 31 and molten solder 5a. As shown in FIG. 1, circulation device 37 may be provided for collecting deposited molten solder 5a for reuse. Circulation device 37 sends molten solder 5a deposited at the bottom of organic fatty acid-containing solution bath 22 to ejection unit 33 for spraying molten solder 5a.

In addition, organic fatty acid-containing solution 31 and molten solder 5a can be separated by a specific gravity difference, and molten solder 5a deposited at the bottom of organic fatty acid-containing solution bath 22 can be taken out to be separated from organic fatty acid-containing solution 31. Such separated molten solder 5a and organic fatty acid-containing solution 31 can be reused after performing filter processing and the like if necessary.

(Re-Immersion Processing in Organic Fatty Acid-Containing Solution)

Workpiece member 10 after the removal of excess molten solder 5a during pulling down in space section 24 is re-immersed in organic fatty acid-containing solution 31. Re-immersion processing C, as shown in FIG. 1, for example, is arranged near the rim of the same bath as organic fatty acid-containing solution bath 22, is an area where workpiece member 10 is fed again into organic fatty acid-containing solution 31. Further, re-immersion processing unit C is arranged symmetrically with immersion processing unit A.

As described above, the temperature of organic fatty acid-containing solution 31 of re-immersion processing unit C is the same as the temperature of the other portions in organic fatty acid-containing solution bath 22. Further, since organic fatty acid-containing solution 31, component contained in organic fatty acid-containing solution 31, and the like, an explanation thereof is omitted here (Subsequent Steps)

After pulling out from re-immersion processing C, in discharge section 23 as shown in FIG. 1, organic fatty acid-containing solution 31 adhered to the surface of processed member 11 is drained off. By the draining off, adhered excess organic fatty acid-containing solution 31 can be removed from he surface of processed member 11. The draining off is performed preferably by ejection unit 39 such as an air nozzle. An ejection pressure of ejection unit 39 at that time is not specifically limited and arbitrarily set according to the size and shape of processed member 11. In this manner, there can be obtained processed member 11 processed by all of the above processes.

Processed member 11 drained off is discharged from discharging portion 27 of discharge section 23 of FIG. 1 to outside of soldering device 20.

Above space section 24 shown in FIG. 1, sealing cover 28 to cover the hole of device 20 is provided. Sealing cover 28 is a cover used to seal or roughly seal device 20 except for feeding portion 26 and discharging portion 27. By sealing or roughly sealing the whole of soldering device 20, the diffusion of organic fatty acid-containing solution 31, which has the characteristics that is easy to evaporate when heating to, for example, about 250° C., to the outside of soldering device 20 can be prevented, as well as invading contaminated material from the outside of device 20 into device 20 can be prevented.

When processed member 11 obtained by the above processes is a substrate such as a printed circuit board, on the surface of copper electrode 2 of the substrate are provided copper corrosion prevention layer 4, minimum solder layer 5, and organic fatty acid coating layer 6 in this order. As a result, in a mounting step of the substrate, even when the substrate is dipped in various molten solder baths, fed in a reflow furnace after printing of paste solder, or fed in a combustion furnace, there occurs no copper erosion of copper electrode 2, and also, without deterioration of solder wettability, the substrate can be processed subsequently in mounting steps.

Even when processed member 11 obtained is an electronic component, on the surface of copper electrode 2 of the electronic component are provided copper corrosion prevention layer 4, minimum solder layer 5, and organic fatty acid coating layer 6 in this order. As a result, in a mounting step of the electronic component, even when dipped in various molten solder baths, fed in a reflow furnace after placed on a printed paste solder, or fed in a combustion furnace, there occurs no copper erosion of copper electrode 2 of the electronic component, and also, without deterioration of solder wettability, the electronic component can be processed subsequently in mounting steps.

As described hereinabove, soldering device 20 and soldering method according to the present invention perform continuously; immersion processing in organic fatty acid-containing solution 31; ejection processing of molten solder 5a while pulling out to space section 24; removal processing of excess molten solder 5a performed during pulling down from space section; and re-immersion processing in organic fatty acid-containing solution 31. Accordingly, there can be obtained a substrate and an electronic component in which there occurs no copper corrosion of copper electrodes, as occurring in conventional dipping processing, and no copper corrosion occurs in subsequent various mounting steps. As a result, there can be produced, at low cost, a substrate and an electronic component that achieve high reliability on copper electrode 2 as an electrical joint and have high yield.

Particularly, after immersion in organic fatty acid-containing solution 31, whiling pulling out workpiece member 10 to space section 24 under the steam atmosphere of organic fatty acid-containing solution 31 jet stream 5' of molten solder 5a is sprayed to copper electrode 2 provided on workpiece member 10 in order to adhere molten solder 5a on copper electrode 2. Further, while pulling down workpiece member 10 from space section 24, organic fatty acid-containing solution 31 is sprayed to excess molten solder 5a of workpiece member 10 for removal. Therefore, on the cleaned surface of copper electrode 2 can be formed copper corrosion prevention layer 4 uniformly without any defect, as well as workpiece member 10 is re-immersed in organic fatty acid-containing solution 31 in the state in which excess molten solder 5a has been removed, so as to provide organic fatty acid coating layer 6. As a result, there is provided organic fatty acid coating layer 6 maintaining solder wettability of solder layer 5 in a state in which minimum solder layer 5 has been provided on copper corrosion prevention layer 4. Thus, in subsequent mounting steps, even when dipped in various molten solder baths, fed in a reflow furnace after printing of paste solder, or fed in a combustion furnace, there occurs no copper erosion of copper electrode, and also, without deterioration of solder wettability, the member can be processed subsequently in mounting steps.

[Produced Substrate and Electronic Component]

Figure 3:
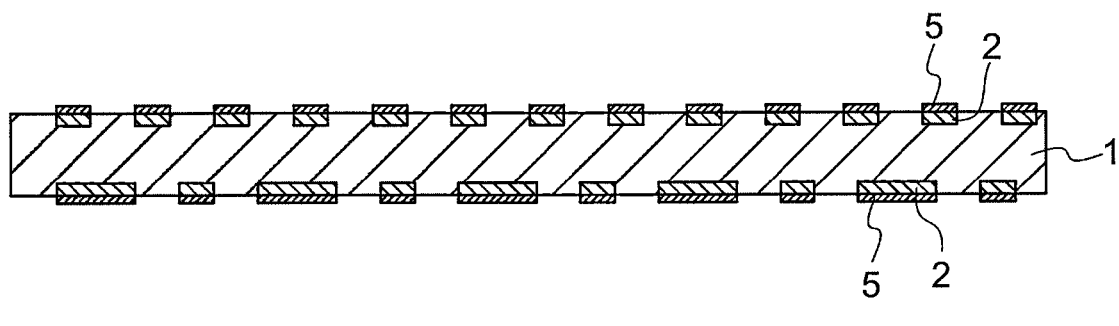
FIG. 3 is a schematic cross-sectional view illustrating one example of a substrate that has been processed (post-processed member).

Substrate 10 according to the present invention is, as shown in FIG. 3, a substrate produced by soldering device 20 or the soldering method according the present invention described above. On copper electrode 2 provided on substrate 10, copper corrosion prevention layer 4, minimum solder layer 5, and organic fatty acid coating layer 6 are provided in this order from the surface of copper electrode 2. Examples of substrate 10 include various substrates such as a printed circuit board, a wafer, and a flexible substrate. Particularly, since electrode width and pitch of wafers are narrow, it is preferable to use the device and the method according to the present invention, whereby solder layer 5 can be provided with high precision on microelectrodes arranged at narrow pitch. In addition, even in the cases of printed circuit boards and flexible substrates adapted to be provided with large electronic components thereon, the surface of solder layer 5 can be maintained in a cleaned state or can be processed in a later step, so that those substrates can be used as reliable ones.

In addition, as shown in FIGS. 9A and 9B and FIGS. 10A and 10B, an electronic component according to the present invention is electronic component 40, 51 or 52 produced by the soldering device 20 or the soldering method according to the present invention described above. On copper electrode 2 provided on electronic component 40, 51 or 52, copper corrosion prevention layer 4, minimum solder layer 5, and organic fatty acid coating layer 6 are provided in this order from the surface of copper electrode 2. Examples of the electronic component include a semiconductor chip, a semiconductor module, an IC chip, an IC module, a dielectric chip, a dielectric module, a resistor chip, and a resistor module.

According to the substrate and the electronic component thus formed, even when heat is applied in a reflow furnace, a combustion furnace, or the like after that, copper corrosion prevention layer 4 blocks copper corrosion of copper electrode 2. As a result of that, reliability on electrical joints (copper electrode portions) in an electronic component mounting step performed through various steps is not deteriorated, and the electronic component can be produced with high yield. Therefore, highly reliable substrates and electronic components can be provided at low cost.

EXAMPLES

Hereinafter, the present invention will be described in more detail with reference to an Example and a Comparative Example.

Example 1

As one example, substrate 10 was prepared by forming a pattern of copper wires having a width of 200 μm and a thickness of 10 μm on base 1. On this substrate 10, only copper electrodes 2 of the copper wire pattern having the width of 200 μm and a length of 50 μm, which serve as a mounting portion of an electronic component, are exposed in great numbers, and the other copper wires of the pattern are covered with an insulation layer.

As organic fatty acid-containing solution 31 fed into organic fatty acid-containing solution bath 22, an organic fatty acid-containing solution was prepared by including palmitic acid up to an amount of 10 mass % in an ester synthetic oil that does not contain metal salts such as nickel chloride and cobalt chloride, an antioxidant, and the like. The temperature of organic fatty acid-containing solution 3a in organic fatty acid-containing solution bath 22 was controlled to 250° C.° C. Molten solder 5a used was prepared by a quinary lead-free solder consisting of Ni; 0.05 mass %, Ge: 0.005 mass %, Ag; 3 mass %, Cu: 0.5 mass %, and Sn for the rest, and by heating to 250° C.

Space section 24 was first filled with organic fatty acid-containing solution 31 up to the top surface thereof, and then, nitrogen gas was introduced to form an upper space. In that state, the temperature of organic fatty acid-containing solution 31 was increased up to 250° C. to fill the upper space with a steam of organic fatty acid-containing solution 31. Into soldering device 20 thus prepared, substrate 10 was fed.

Substrate 10 was being conveyed and immersed in immersion processing section A of organic fatty acid-containing solution 31 to provide organic fatty acid coating layer 3 on copper electrode 2 (for example, see FIG. 4B). Organic fatty acid coating layer 3 is adhered as the result of cleaning of the copper surface by organic fatty acid-containing solution 31. Substrate 10 is pulled put from organic-fatty acid-containing solution 31, as shown in FIG. 1 and FIG. 5, after Substrate 10 is moved horizontally in immersion processing section A. Further, jet stream 5' of molten solder 5a, for example, at 250° C., was ejected from ejection nozzles 33 set towards both of the surfaces of substrate 10. On copper electrode 2 where molten solder 5a has been sprayed, molten solder 5a was formed into a swollen shape, as shown in FIG. 4C, for example.

Subsequently, as shown in FIG. 1, substrate 10 was being moved horizontally in space section 24, and then, excess molten solder 5a on substrate 10 was removed while pulling down to the lower side of organic fatty acid-containing solution bath 22 (see FIG. 1 and FIG. 6). The removal of excess molten solder 5a was performed by ejection nozzles 34 both set at an inclination of, for example, 30 degrees with respect to both surfaces of substrate 10. Organic fatty acid-containing solution 31 at, for example, at 250° C., was sprayed from ejection nozzles 34. As a result of that, there was obtained substrate 11 having a configuration shown in FIG. 4D. Further, on copper electrode 2 is provided substrate 11 having copper corrosion prevention layer 4, solder layer 5 and organic fatty acid coating layer 6 in order. After that, substrate 11 was conveyed in organic fatty acid-containing solution bath 22 horizontally, and then, pulled out from organic fatty acid-containing solution bath 22. Immediately after substrate 11 was conveyed out from organic fatty acid-containing solution 31, organic fatty acid-containing solution 31 was drained off by air ejection from an air nozzle 39, thereby obtaining substrate 11.

Figure 11B:
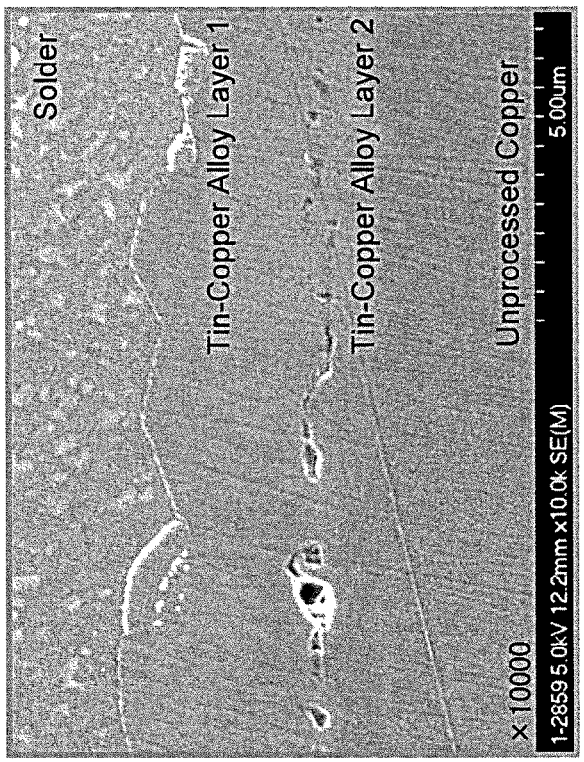
FIGS. 11A to 11D are examples of forms of micro voids occurred after heating of a soldered copper electrode portion.
Figure 11A:
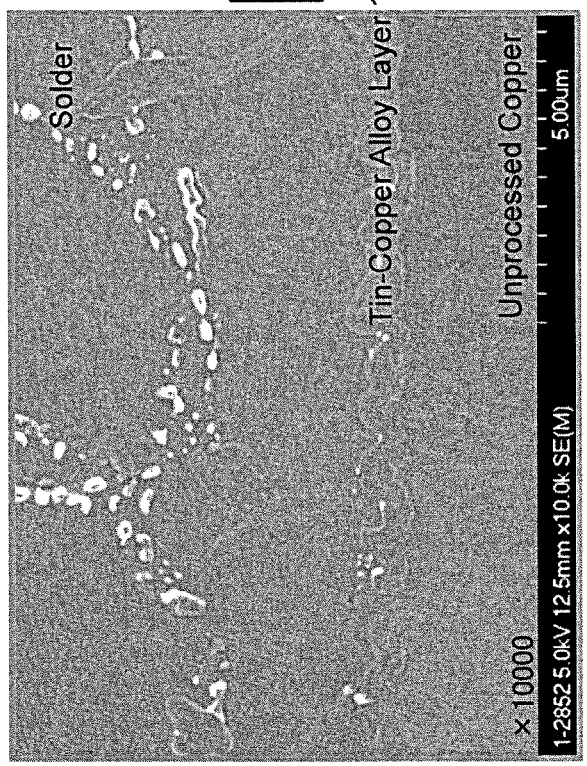
Figures 11C, 11D:
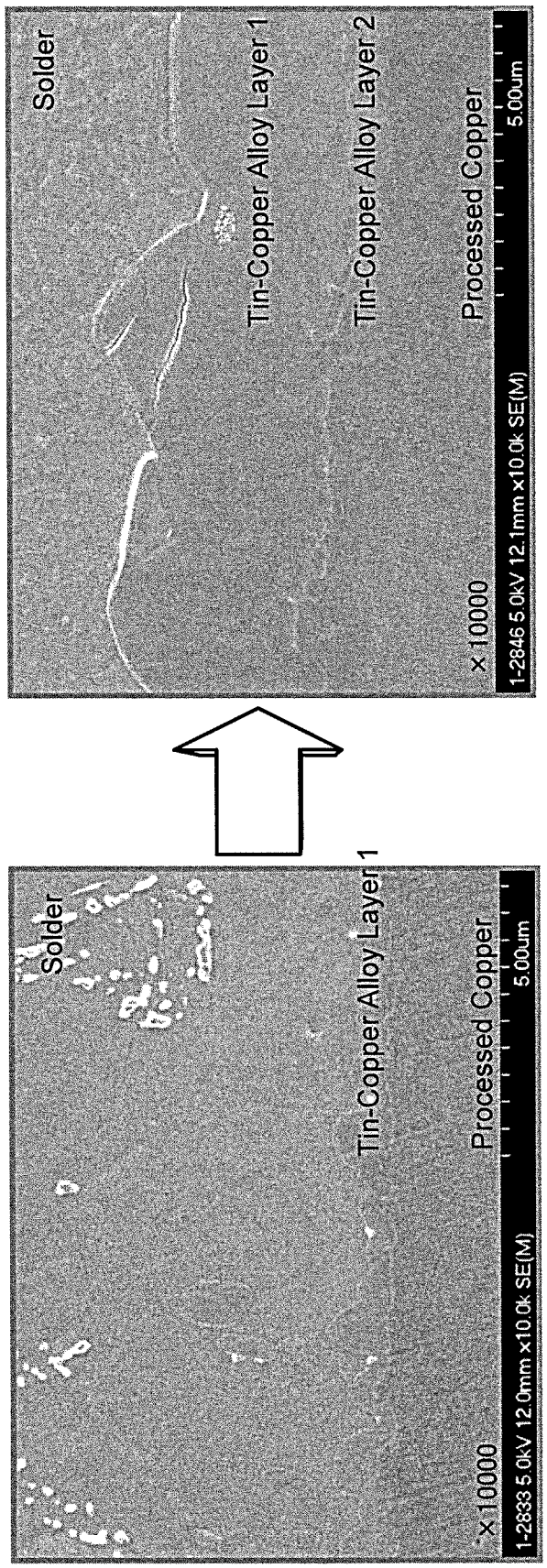

A scanning electron micrographic configuration of a cross-section of solder layer 5 of substrate 11 obtained is shown in FIG. 11C. From the cross-sectional photograph shown in FIG. 11C, a thickness of Cu—Ni—Sn intermetallic compound layer 4 was measured by a scanning electron micrograph. As a result of this, what the layer was uniformly formed with a thickness of 1.5 µm is found. In addition, FIG. 11D is a scanning electron micrographic configuration of a cross section of solder layer 5 after aging for 240 hours at 150° C. There were no defects such as voids. Furthermore, the cross-section was evaluated by element mapping of an X-ray micro analyzer (EPMA) and shown in FIGS. 12A and 12B.

Comparative Example 1

Figure 12A:
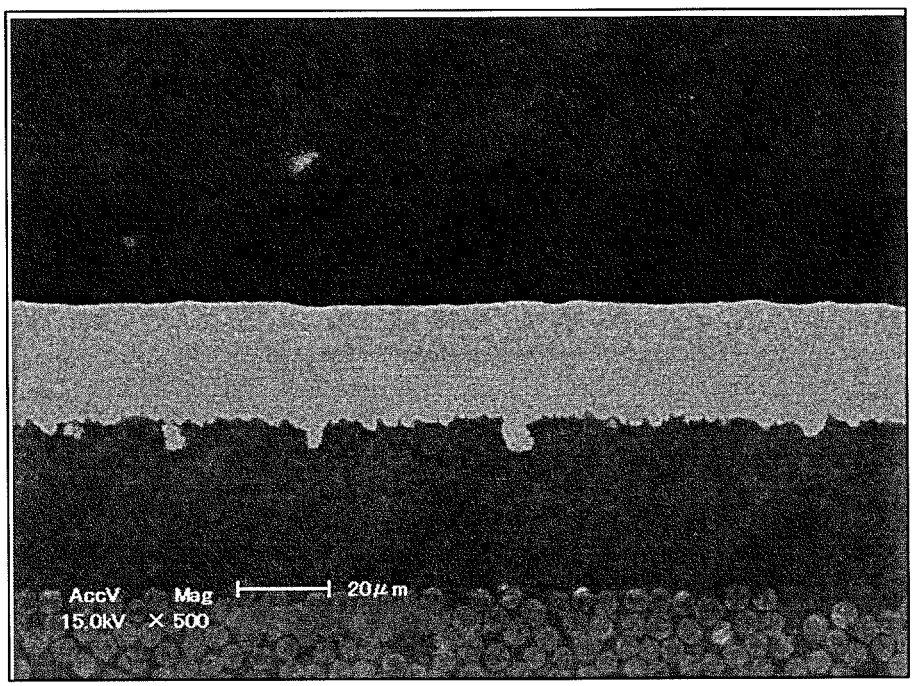
FIGS. 12A and 12B are element-mapping images of a solder joint portion obtained in the Example.
Figure 12B:
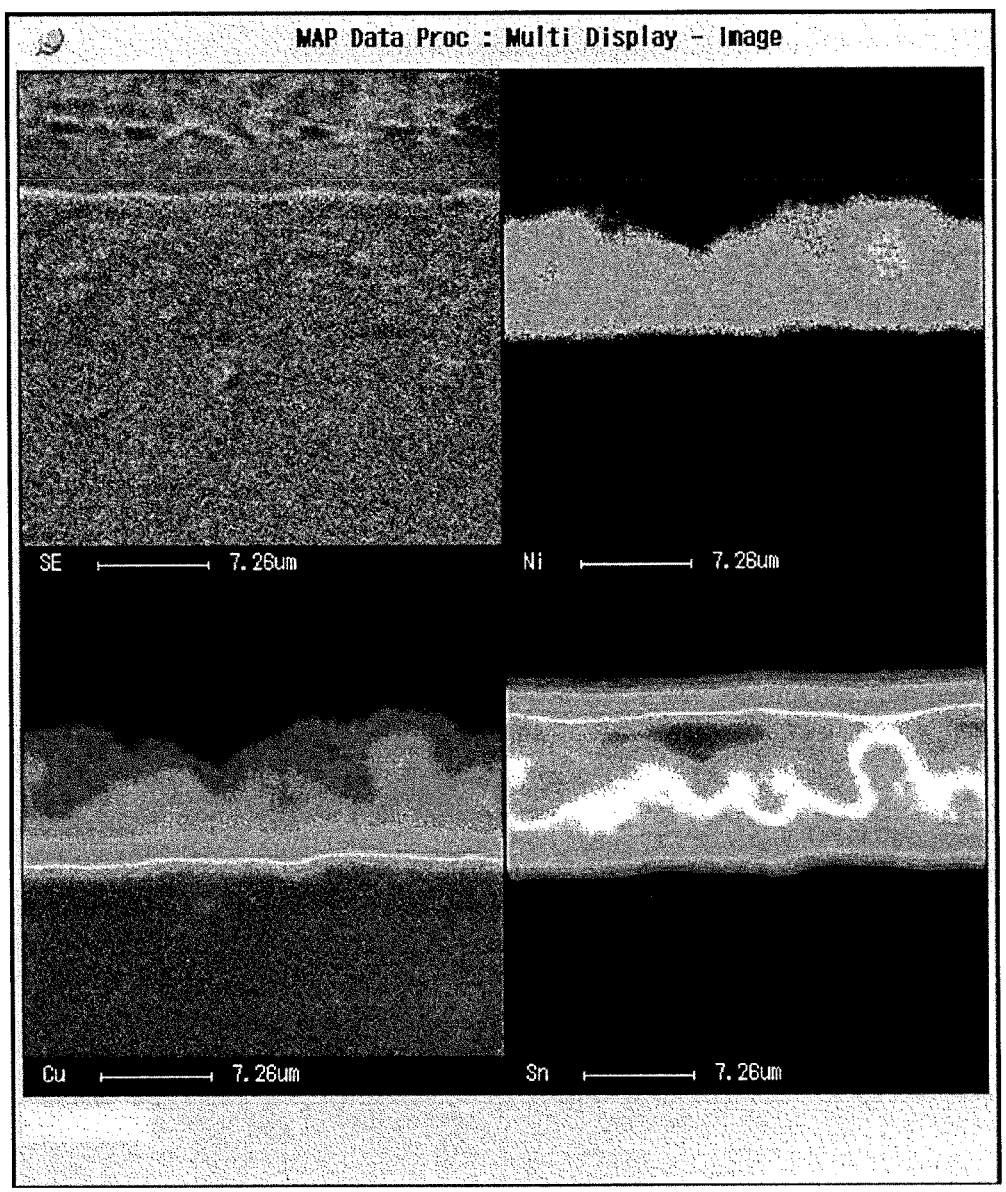
Figure 14A:
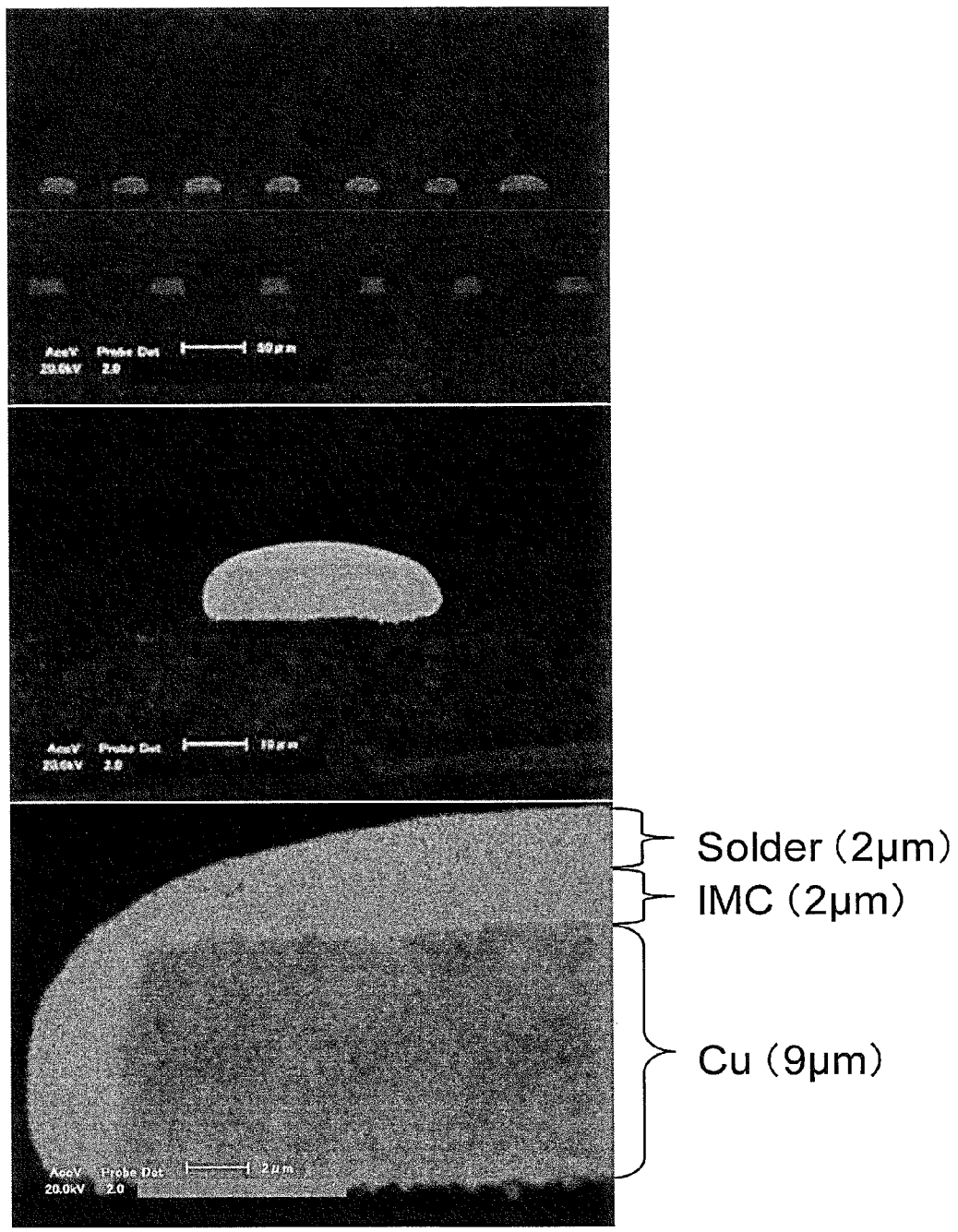
FIG. 14A is an electron micrograph showing a cross-section of a configuration that has a copper corrosion prevention layer, a solder layer and an organic fatty acid coating layer in order on a copper electrode having a micro substrate.
Figure 14B:
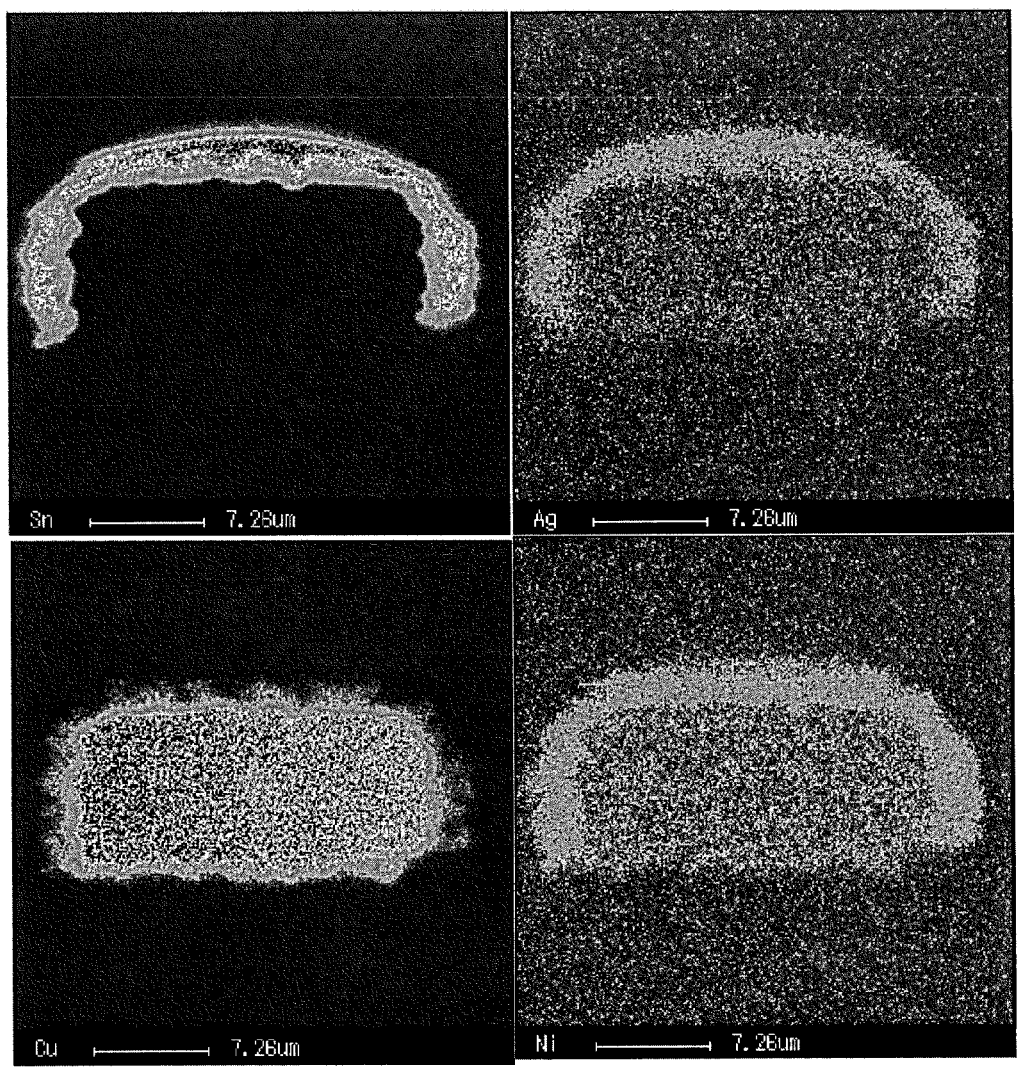
FIG. 14B is an image evaluated by element mapping thereof.

A substrate of Comparative Example 1 was obtained in the same manner as in Example 1 except for using, as a solder material, a ternary lead-free solder consisting of Ag: 3 mass %, Cu: 0.5 mass %, and Sn for the rest. As with Example 1, from a scanning electron micrograph of a cross-section, there was no Cu—Ni—Sn intermetallic compound layer (see FIG. 12A), and on copper electrode 2 was formed Cu—Sn intermetallic compound layer 13b. In addition, FIG. 12B is a scanning electron micrographic configuration of a cross-section of solder layer 5 after aging for 240 hours at 150° C., in which a defect such as a void was found.

Example 2

In Example 1, as base 1, substrate 10 having a width of 25 µm, thickness of about 9 µm, and a pitch of the copper electrodes of about 55 µm is used (for example, see FIGS. 13A to 13C and FIGS. 14A and 14B). Substrate 11 of Example 2 was obtained by the other conditions that are the same as in Example 1.

FIGS. 13A and 13B are plane views showing obtained substrate 11, and FIG. 13C is a perspective view obtained substrate 11. FIGS. 13A and 13B are optical micrographs, and FIG. 13C is an electron micrograph. By the micrograph of FIG. 3, what solder layer 5 was provided cleanly without any defect and failure was confirmed. FIGS. 14A to 14D are electron micrograph of a cross-section of obtained substrate 11, and an image evaluated by element mapping of an X-ray micro analyzer (EPMA). As shown in FIGS. 12A and 12B, on copper electrode 2, what copper corrosion prevention layer 4 having a thickness of about 2 µm and solder layer 5 having a thickness of 2 µm are provided in order is confirmed. Also, what organic fatty acid coating layer 6 is adhered on solder layer 5 is confirmed.

DESCRIPTION OF THE REFERENCE NUMERALS

1 Base
2 Copper electrode
3 Coating layer
4 Copper corrosion prevention layer
5 Solder layer
5' Jet stream
5a Molten solder
6 Coating layer
7 Cu—Sn compound layer
10 Workpiece member (substrate or electronic component)
11 Processed member
20 Soldering device
21 Feeding section
22 Organic fatty acid-containing solution bath
23 Discharge section
24 Space section
25 Sealing cover
26 Feeding portion
28 Conveying unit (belt conveyor convey)
31 Organic fatty acid-containing solution
31' Sprayed liquid of the organic fatty acid-containing solution
32 Steam atmosphere of the organic fatty acid-containing solution
33 Ejection unit (ejection nozzle of molten solders)
34 Ejection unit (ejection nozzle of the organic fatty acid-containing solutions)
35 Feeding path of the molten solder
36 Feeding path of the organic fatty acid-containing solution
37 Circulation device for sending molten solder
39 Ejection unit (Removal unit for removal of excess organic fatty acid-containing solutions)
40 Electronic component
41 Element
42 Support jig of an electronic component
51,52 Semiconductor chip
A Immersion processing section
B Molten solder adhesion processing section and removal processing section of the excess molten solder
C Re-immersion processing section

The invention claimed is:

1. A soldering device, comprising:
a first processing section that immerses a workpiece member having a copper electrode in organic fatty acid-containing solution, and horizontally move the workpiece member in the organic fatty acid-containing solution;
a second processing section having an ejection unit to spray a jet stream of a molten solder to the workpiece member while pulling out the workpiece member processed in the first processing section to a space section that has a pressurized steam atmosphere and is provided above the organic fatty acid-containing solution;
a third processing section having an ejection unit to spray the organic fatty acid-containing solution to excess molten solder on the workpiece member for removal while pulling down the workpiece member processed in the second processing section after horizontally moving in the space section;
a fourth processing section that picks up the workpiece member processed in the third processing section by pulling out from the organic fatty acid-containing solution after horizontally moving in the organic fatty acid-containing solution;
a conveying unit move the workpiece member from the first processing section to the fourth processing section;
a feeding portion into which the workpiece member is fed to the first processing section; and
a discharge portion from which the workpiece member is discharged from the fourth section, wherein
the first processing section to the fourth processing section are sealed except for the feeding portion and the discharge portion.

2. The soldering device according to claim 1, wherein the organic fatty acid-containing solution is a palmitic acid-containing solution.

3. The soldering device according to claim 1, wherein the molten solder is a molten solder processed with the organic fatty acid-containing solution.

4. The soldering device according to claim 1, wherein the liquid for removing the excess of the molten solder is the organic fatty acid-containing solution.

5. The soldering device according to claim 1, further comprising, after the fourth processing section, an ejection unit that drains off the organic fatty acid-containing solution adhered to a surface of the workpiece member.

6. The soldering device according to claim 1, wherein the space section is pressurized by steam of the organic fatty acid-containing solution.

7. The soldering device according to claim 1, wherein the temperature of the space section and the temperature of the organic fatty acid-containing solution are the same, and the temperature of the inside of the space section is the same as or higher than the temperature of molten solder sprayed in the space section.

8. The soldering device according to claim 1, further comprising a circulation device that collects the molten solder deposited at the bottom of the organic fatty acid-containing solution below the ejection unit, and provide the collected molten solder to the ejection unit for spraying the molten solder.

9. A soldering method, comprising:
 a first processing step of immersing a workpiece member having a copper electrode in organic fatty acid-containing solution, and horizontally moving the workpiece member in the organic fatty acid-containing solution;
 a second processing step of spraying a jet stream of a molten solder to the workpiece member while pulling out the workpiece member processed by the first processing step to a space section that has a pressurized steam atmosphere and is provided above the organic fatty acid-containing solution;
 a third processing step of spraying the organic fatty acid-containing solution to excess molten solder on the workpiece member for removal while pulling down the workpiece member processed by the second processing step after horizontally moving in the space section;
 a fourth processing step of picking up the workpiece member processed by the third processing step, by pulling out from the organic fatty acid-containing solution after horizontally moving in the organic fatty acid-containing solution; wherein
 a soldering device is used, the soldering device having:
  a conveying unit move the workpiece member from the first processing section to the fourth processing section;
  a feeding portion into which the workpiece member is fed to the first processing section; and
  a discharge portion from which the workpiece member is discharged from the fourth section, wherein
 the first processing section to the fourth processing section are sealed except for the feeding portion and the discharge portion.

\* \* \* \* \*